US010249675B1

(12) United States Patent
Wang et al.

(10) Patent No.: US 10,249,675 B1
(45) Date of Patent: Apr. 2, 2019

(54) BACKSIDE ILLUMINATED IMAGE SENSOR WITH SELF-ALIGNED METAL PAD STRUCTURES

(71) Applicant: OmniVision Technologies, Inc., Santa Clara, CA (US)

(72) Inventors: Qin Wang, San Jose, CA (US); Gang Chen, San Jose, CA (US)

(73) Assignee: OmniVision Technolgies, Inc., Santa Clara, CA (US)

( * ) Notice: Subject to any disclaimer, the term of this patent is extended or adjusted under 35 U.S.C. 154(b) by 0 days.

(21) Appl. No.: 15/707,940

(22) Filed: Sep. 18, 2017

(51) Int. Cl.
*H01L 27/146* (2006.01)
(52) U.S. Cl.
CPC .... *H01L 27/14636* (2013.01); *H01L 27/1463* (2013.01); *H01L 27/1464* (2013.01); *H01L 27/14687* (2013.01)

(58) Field of Classification Search
CPC ............. H01L 27/1463; H01L 27/1464; H01L 27/14687
USPC .......................................... 257/21, 222, 228
See application file for complete search history.

(56) References Cited

U.S. PATENT DOCUMENTS

| | | | |
|---|---|---|---|
| 2010/0244173 A1* | 9/2010 | Wang ................. | H01L 27/14623 257/435 |
| 2014/0124889 A1* | 5/2014 | Qian ................. | H01L 27/14618 257/448 |
| 2017/0186802 A1* | 6/2017 | Huang .............. | H01L 27/14636 |
| 2017/0229494 A1* | 8/2017 | Hsu ................... | H01L 27/14636 |

* cited by examiner

*Primary Examiner* — David Vu
*Assistant Examiner* — Brandon Fox

(57) ABSTRACT

An image sensor comprises a semiconductor material having a front side and a back side opposite the front side; a dielectric layer disposed on the front side of the semiconductor material; a poly layer disposed on the dielectric layer; an interlayer dielectric material covering both the poly layer and the dielectric layer; an inter-metal layer disposed on the interlayer dielectric material, wherein a metal interconnect is disposed in the inter-metal layer; and a contact pad trench extending from the back side of the semiconductor material into the semiconductor material, wherein the contact pad trench comprises a contact pad disposed in the contact pad trench, wherein the contact pad and the metal interconnect are coupled with a plurality of contact plugs; and at least an air gap isolates the contact pad and side walls of the contact pad trench. The poly layer and the semiconductor material between adjacent two STI structures of a plurality of first and second STI structures are used as hard masks to form the plurality of contact plugs by selectively removing the dielectric materials between a first side of the plurality of first STI structures and the metal interconnect, wherein each of the plurality of contact plugs extends from the first side of each of the plurality of first STI structures through each of the plurality of first STI structures into the interlayer dielectric material and vertically abuts the metal interconnect.

19 Claims, 5 Drawing Sheets

400

| providing a semiconductor material having a front side and a back side opposite the front side; forming a plurality of first shallow trench isolation (STI) structures and a plurality of second STI structures extending from the front side of the semiconductor material into the semiconductor material, wherein each of the plurality of first STI structures is fully surrounded by adjacent first and second STI structures and each of the plurality of second STI structures is partially surrounded by adjacent first and second STI structures | 401 |

↓

| disposing a dielectric layer and a poly layer on the front side of the semiconductor material, wherein the poly layer is disposed on the dielectric layer, wherein a plurality of open slots are formed in the poly layer extending from the first side of the poly layer to the interface of the poly layer and the dielectric layer, wherein each of the plurality of open slots aligns up with each of the plurality of first STI structures and has same two dimensional lateral dimensions as the aligned first STI structure; | 402 |

↓

| disposing an interlayer dielectric material at the front side of the semiconductor material, wherein the dielectric layer and the poly layer are covered by the interlayer dielectric material, wherein the plurality of open slots are filled with the interlayer dielectric material; forming a metal interconnect in an inter-metal dielectric layer, wherein the inter-metal dielectric material is disposed on the interlayer dielectric material, wherein the metal interconnect aligns up with the plurality of open slots; | 403 |

↓

| forming a contact pad trench by partially removing the semiconductor material between the backside of the semiconductor and a first side of the plurality of first and second STI structures, wherein the edge of the contact pad trench locates on the plurality of second STI structures; | 404 |

↓

| forming a plurality of contact plugs by selectively removing the dielectric material between the first side of each of the plurality of first STI structures and the metal interconnect; wherein each of the plurality of contact plugs extends from each of the first side of the plurality of first STI structures through each of the plurality of first STI structures into the interlayer dielectric material and abuts the metal interconnect; | 405 |

↓

| forming a contact pad by disposing a conductive material in the contact pad trench, wherein the contact pad is isolated from the sidewalls of the contact pad trench, and are coupled with the metal interconnect by the plurality of contact plugs wherein the plurality of contact plugs are filled with the conductive material. | 406 |

FIG. 4

BACKSIDE ILLUMINATED IMAGE SENSOR WITH SELF-ALIGNED METAL PAD STRUCTURES

TECHNICAL FIELD

This disclosure relates generally to semiconductor image sensors, and in particular but not exclusively, relates to backside illuminated semiconductor image sensors.

BACKGROUND INFORMATION

Image sensors have become ubiquitous. They are widely used in digital still cameras, cellular phones, security cameras, as well as medical, automobile, and other applications. The device architecture of image sensors has continued to advance at a great pace due to increasing demands for higher resolution, lower power consumption, increased dynamic range, etc. These demands have also encouraged the further miniaturization and integration of image sensors into these devices.

The typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene.

While there are a variety of ways to make image sensors, reducing the number of steps with fewer photo masks in semiconductor processing applications is always important. Since every fabrication step adds cost and time on the assembly line, new techniques to enhance image sensor throughput are needed.

BRIEF DESCRIPTION OF THE DRAWINGS

Non-limiting and non-exhaustive examples of the invention are described with reference to the following figures, wherein like reference numerals refer to like parts throughout the various views unless otherwise specified.

FIG. 4 illustrates one example process flow for fabricating an example image sensor with a self-aligned metal pad structure, in accordance with the teachings of the present invention.

Figure 1A:
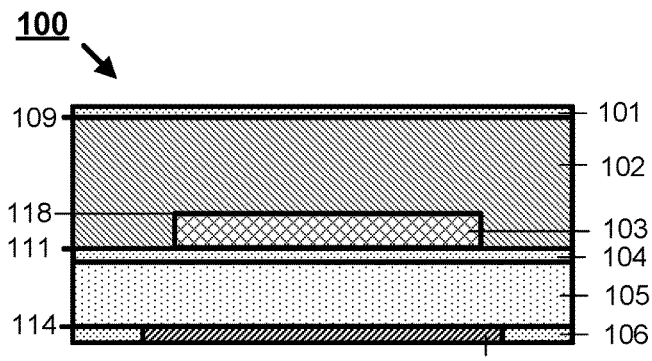
FIG. 1A-FIG. 1D are cross sectional illustrations of an example image sensor, wherein each of the figures represents the example image sensor after a series of critical process steps are finished during fabrication of the example image sensor with a standard metal pad structure in FIG. 1D, in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for an image sensor with simplified process are described herein. In the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Figure 2A:
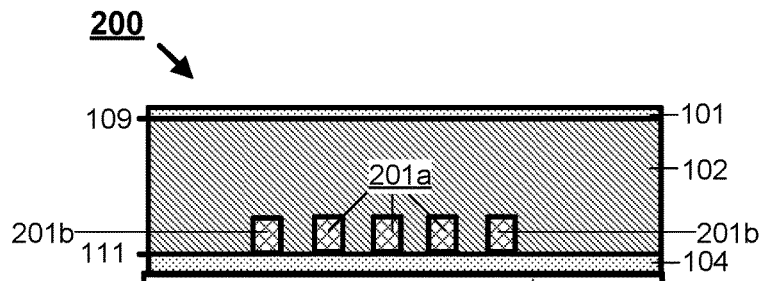
FIG. 2A-FIG. 2F are cross sectional illustrations of an example image sensor, wherein each of the figures represents the example image sensor after a series of critical process steps are finished during fabrication of the example image sensor with a self-aligned metal pad structure in FIG. 2F, in accordance with the teachings of the present invention.
Figure 2B:
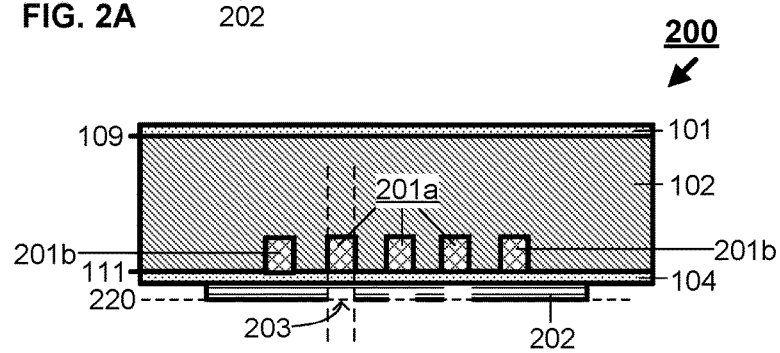
Figure 2C:
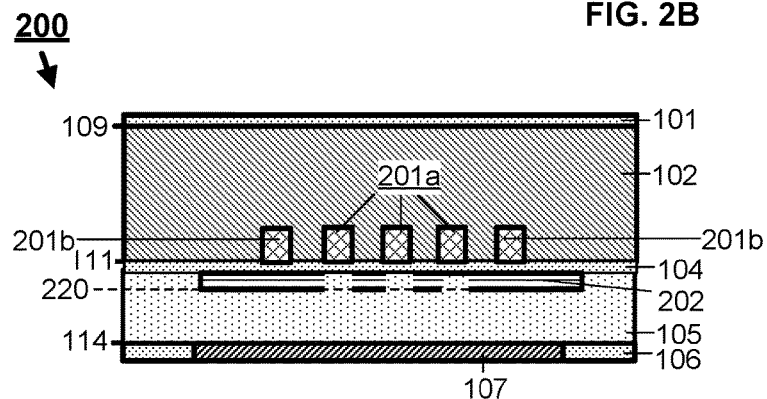
Figure 2D:
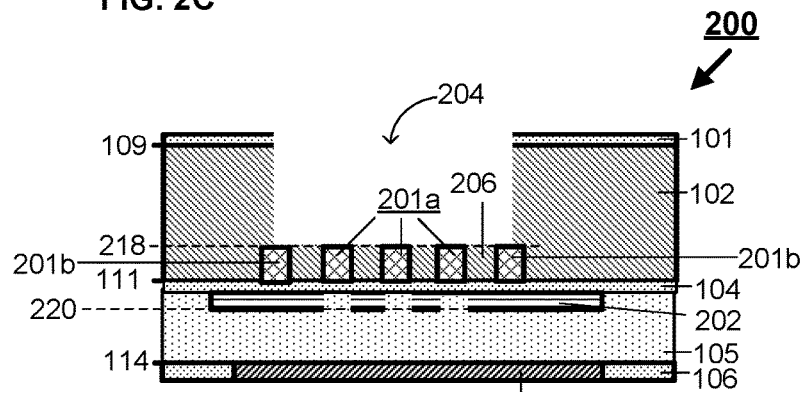
Figure 2E:
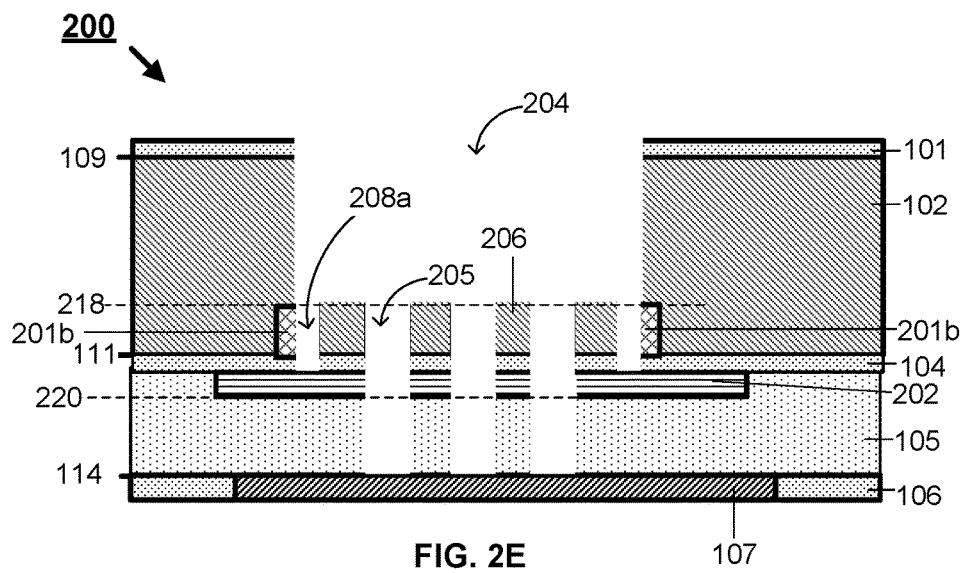
Figure 2F:
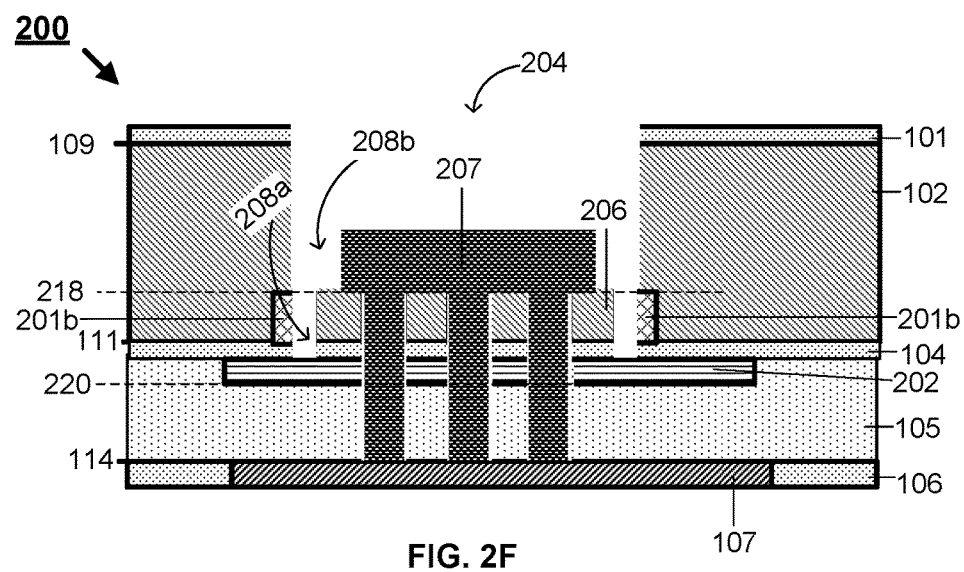
Figure 3:
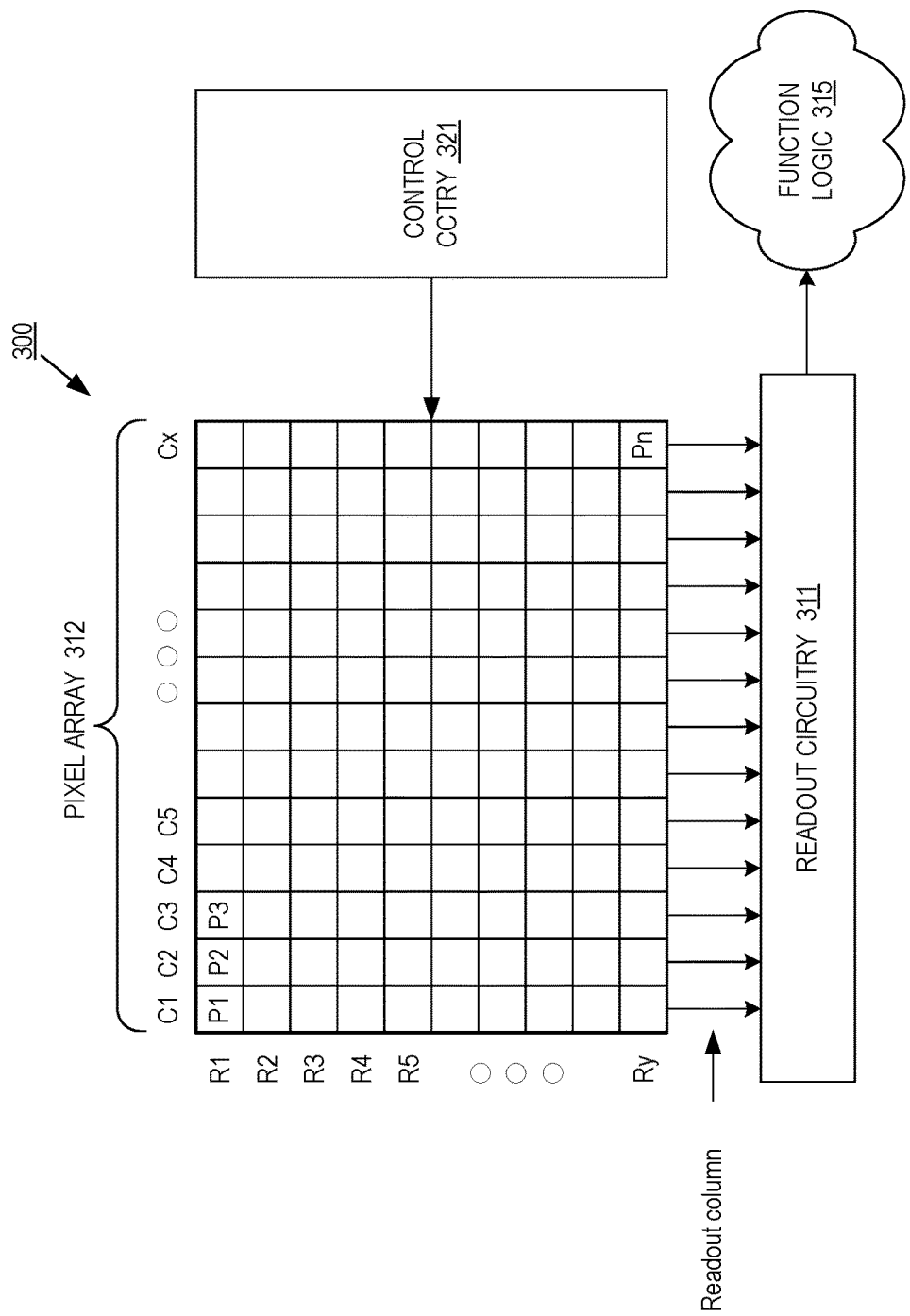
FIG. 3 is a block diagram schematically illustrating one example of an imaging system with self-aligned metal pad structures, in accordance with the teachings of the present invention.

FIG. 3 is a block diagram schematically illustrating one example of an imaging system 300 with self-aligned metal pad structures, in accordance with the teachings of the present invention. Imaging system 300 includes pixel array 312, control circuitry 321, readout circuitry 311, and function logic 315. Readout circuitry 311 and control circuitry 321 may be at least partially disposed in inter-metal layer 106 of FIGS. 2A-2F. For example, a metal interconnect 107 may be included in at least one of readout circuitry and control circuitry.

Referring back to FIG. 3, in one example, pixel array 312 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, in other examples, it is appreciated that the photodiodes do not have to be arranged into rows and columns and may take other configurations.

In one example, after the image sensor photodiode/pixel in pixel array 312 has acquired its image data or image charge, the image data is readout by readout circuitry 311 and then transferred to function logic 315. In various examples, readout circuitry 311 may include amplification circuitry, analog-to-digital conversion (ADC) circuitry, or otherwise. Function logic 315 may simply store the image data or even manipulate the image data by applying post image effects (e.g., crop, rotate, remove red eye, adjust brightness, adjust contrast, or otherwise). In one example, readout circuitry 311 may readout a row of image data at a time along readout column lines (illustrated) or may readout the image data using a variety of other techniques (not illustrated), such as a serial readout or a full parallel readout of all pixels simultaneously.

In one example, control circuitry 321 is coupled to pixel array 312 to control operation of the plurality of photodiodes in pixel array 312. For example, control circuitry 321 may generate a shutter signal for controlling image acquisition. In one example, the shutter signal is a global shutter signal for simultaneously enabling all pixels within pixel array 312 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 300 may be included in a digital camera, cell phone, laptop computer, automobile or the like. Additionally, imaging system 300 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 300, extract image data from imaging system 300, or manipulate image data supplied by imaging system 300.

Figure 1B:
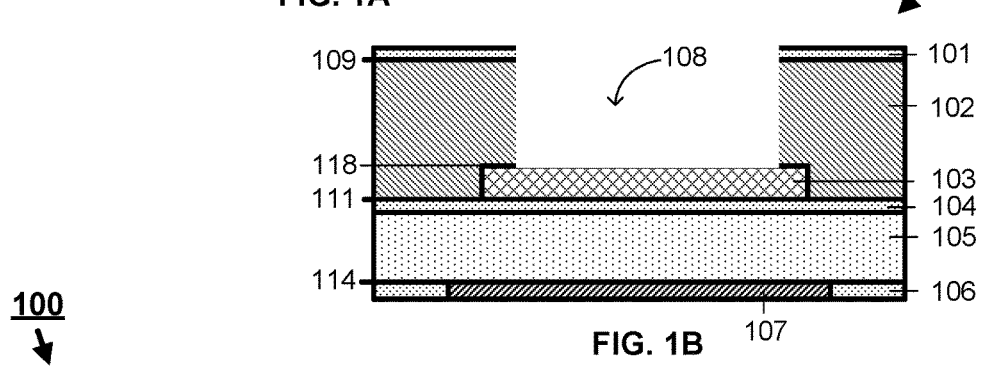
Figure 1C:
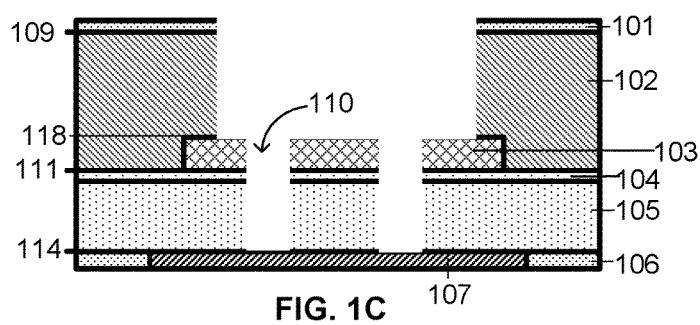
Figure 1D:
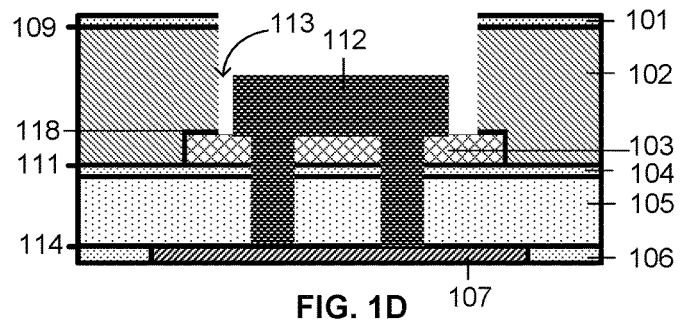

FIG. 1A-FIG. 1D are cross sectional illustrations of an example image sensor 100, wherein each of the figures represents the example image sensor 100 after a series of critical process steps are finished during fabrication of the example image sensor 100 with a standard metal pad structure in FIG. 1D, in accordance with the teachings of the present invention. In order to keep the description consistent and simple, the same structure is defined with the same number in FIG. 1A-FIG. 1D.

FIG. 1A illustrates a cross sectional view of the example image sensor 100 comprising a semiconductor material 102 having a front side 111 and a back side 109 opposite the front side 111. In the semiconductor material 102, there is a shallow trench isolation (STI) structure 103 which extends from the front side 111 of the semiconductor material 102 into the semiconductor material 102. The STI structure 103 is used to electrically separate adjacent image sensors. In one example, the STI structure 103 is filled by at least one of dielectric materials such as silicon oxide or silicon nitride. In another example, the STI structure 103 may also comprise a negative charged material liner at an interface between the filled dielectric materials and the semiconductor material 102 (not illustrated in the figures). The negative charged material liner is used to form a P+ pinning layer at the interface between the filled dielectric materials and the semiconductor material 102 in order to reduce the dark current and white pixels. On the front side 111 of the semiconductor material 102, there are also a thin dielectric layer 104, an interlayer dielectric material 105 and an inter-metal layer 106. The thin dielectric layer 104 may be the gate oxide of the pixel transistors. The interlayer dielectric material 105 is disposed between the thin dielectric layer 104 and the inter-metal layer 106. In the inter-metal layer 106, there is a metal interconnect 107 wherein the metal interconnect 107 is made of at least one of metals comprising Cu and TiN. The interlayer dielectric material 105, the dielectric layer 104 and the inter-metal layer 106 are made of at least one of dielectric materials comprising silicon oxide and silicon nitride. In one example, they are made of same dielectric materials. In another example, they are made of different dielectric materials. In one example, a buffer layer 101 is disposed on the back side 109 of the semiconductor material 102 in order to protect the back side 109 of the semiconductor material 102. The buffer layer 101 comprises at least one of dielectric materials such as silicon oxide or silicon nitride.

FIG. 1B illustrates a cross sectional view of the example image sensor 100 after a contact pad trench 108 is formed in the example image sensor 100 of FIG. 1A. In one example, the contact pad trench 108 extends from the back side 109 of the semiconductor material 102 into the semiconductor material 102 until lands on a first side 118 of the STI structure 103, wherein the contact pad trench 108 is enclosed with the STI structure 103. In one example, the contact pad trench 108 is formed by a first patterning process which comprises at least a first photolithography process followed by a first etch processes comprising at least one of a first anisotropic plasma etch and a first selective wet etch process. The first etch processes have significantly higher etch rate for the semiconductor material 102 compared to the dielectric materials in the STI structure 103. Therefore, the first etch processes stop on the first side 118 of the STI structure 103. In another example, the contact pad trench 108 extends from the buffer layer 101 into the semiconductor material 102, wherein the buffer layer 101 is also selectively etched during the first patterning process to form the contact pad trench 108.

FIG. 1C illustrates a cross sectional view of the example image sensor 100 after a plurality of contact plugs 110 are formed in the example image sensor 100 of FIG. 1B. Each of the plurality of contact plugs 110 extends from the first side 118 of the STI structure 103 through the dielectric layer 104, the interlayer dielectric material 105 and lands on the metal interconnect 107 at the interface 114 between the interlayer dielectric material 105 and the metal interconnect 107. In one example, each of the plurality of contact plugs 110 is formed by a second patterning process which comprises at least a second photolithography process followed by at least one of a second anisotropic plasma dry etch and a second selective wet etch process. In the second etch processes, the second etch rates for the dielectric materials in the STI structures 103, the interlayer dielectric material 105 and the dielectric layer 104 are significantly higher than the second etch rates for the conductive materials in the metal interconnect 107. Therefore, the second etch processes stop at the interface 114 between the interlayer dielectric material 105 and the metal interconnect 107. As a result, each of the plurality of contact plugs 110 lands on the metal interconnect 107.

FIG. 1D illustrates a cross sectional view of the example image sensor 100 after a contact pad 112 is formed in the example image sensor 100 of FIG. 1C. In the contact pad trench 108, the contact pad 112 is disposed on the first side 118 of the STI structure 103 and coupled with the metal interconnect 107 by the plurality of contact plugs 110. In one example, each of the plurality of the contact plugs 110 is filled by at least one of conductive materials comprising Al, W, Cu, and TiN, and the contact pad is made of the same conductive materials as ones in each of the plurality of the contact plugs 110. In another example, the contact pad is made of different conductive materials from ones in each of the plurality of the contact plugs 110. The conductive materials comprise at least one of Al, Cu, W, and TiN. There is at least one air gap 113 between the contact pad 112 and sidewalls of the contact pad trench 108, wherein the air gaps isolate the contact pad 112 from the semiconductor material 102. In one example, the contact pad 112 and the air gap 113 are formed by a third patterning process which comprises at least a third photolithography process followed by at least one of a third anisotropic plasma dry etch and a third selective wet etch process. In the third etch processes, the third etch rates for the conductive materials in the contact pad 112 is significantly higher than the third etch rates for the dielectric materials in the STI structures 103 and the semiconductor material 102. Therefore, the third etch processes stop at the first side 118 of the STI structure 103 and there is no undercut on sidewalls of the contact pad trench 108.

FIG. 2A-FIG. 2F are cross sectional illustrations of an example image sensor 200, wherein each of the figures represents the example image sensor 200 after a series of critical process steps are finished during fabrication of the example image sensor 200 with a self-aligned metal pad structure in FIG. 2F, in accordance with the teachings of the present invention. In order to keep the description consistent and simple, the same structure is defined with the same number in FIGS. 1A-1D and FIG. 2A-2F. FIG. 4 illustrates an example method 400 for forming the example image sensors with a self-aligned metal pad in FIG. 2A-2F, wherein each of the process blocks in FIG. 4 corresponds to one of the figures in FIG. 2A-FIG. 2F as described in the next paragraphs. The order in which some or all process blocks appear in method 400 should not be deemed limited. Rather, one of ordinary skill in the art having the benefit of the present disclosure will understand that some of method 400 may be executed in a variety of orders not illustrated, or even in parallel. Furthermore, method 400 may omit certain process blocks in order to avoid obscuring certain aspects. Alternatively, method 400 may include additional process blocks that may not be necessary in some embodiments or examples of the disclosure.

FIG. 2A illustrates a cross sectional view of the example image sensor 200 comprising a semiconductor material 102 after the corresponding process block 401 and partial process block 402 in FIG. 4 has been done. In the process block 401, the semiconductor material 102 is provided, which has a front side 111 and a back side 109 opposite the front side 111, wherein a plurality of first shallow trench isolation (STI) structures 201a and a plurality of second STI structures 201b are formed extending from the front side 111 of the semiconductor material 102 into the semiconductor material 102, wherein each of the plurality of first STI structures 201a is fully surrounded by adjacent first 201a and second 201b STI structures and each of the plurality of second STI structures 201b is partially surrounded by adjacent first 201a and second 201b STI structures. The plurality of first STI structures 201a and second STI structures 201b are used to electrically separate adjacent image sensors. In one example, each of the plurality of first STI structures 201a and second STI structures 201b is filled by at least one of dielectric materials such as silicon oxide or silicon nitride. In another example, each of the plurality of first STI structures 201a and second STI structures 201b may also comprise a negative charged material liner at an interface between the filled dielectric materials in each of the plurality of first 201a and second 201b STI structures and the semiconductor material 102 (not illustrated in the figures). The negative charged material liner is used to form a P+ pinning layer at the interface so as to reduce the dark current and white pixels.

As illustrated in FIG. 2A and described in the process block 402 in FIG. 4, a dielectric layer 104 may be disposed on the front side 111 of the semiconductor material 102 at the same process step as disposing the gate oxide of the pixel and periphery transistors. Moreover, a poly layer 202 may also be disposed on the thin dielectric layer 104 at the same process step as disposing the poly gate of pixel and periphery transistors. In one example, a buffer layer 101 is disposed on the back side 109 of the semiconductor material 102 in order to protect the back side 109 of the semiconductor material 102. The buffer layer 101 comprises at least one of dielectric materials such as silicon oxide or silicon nitride.

FIG. 2B illustrates a cross sectional view of the example image sensor 200 after a plurality of open slots 203 are formed in the poly layer 202 in the example image sensor 200 of FIG. 2A. The corresponding process block is 402 in FIG. 4. Each of the plurality of open slots 203 extends from a first side 220 of the poly layer 202 to the interface of the poly layer 202 and the dielectric layer 104, wherein each of the plurality of open slots 203 aligns up with each of the plurality of first STI structures 201a and has same two dimensional lateral dimensions as the aligned first STI structure 201a. In one example, the plurality of open slots 203 and the poly gates of the pixel and periphery transistors are formed at the same time with the same patterning process and photo mask. Therefore, compared to the fabrication processes of the standard metal pad structure in FIG. 1A-1D, it does not require an additional patterning process step to form the plurality of open slots 203.

FIG. 2C illustrates a cross sectional view of the example image sensor 200 after an interlayer dielectric material 105 and an inter-metal layer 106 are disposed on the example image sensor 200 of FIG. 2B. The corresponding process block is 403 in FIG. 4. The interlayer dielectric material 105 is disposed between the dielectric layer 104 and the inter-metal layer 106. The dielectric layer 104 and the poly layer 202 are covered by the interlayer dielectric material 105, wherein the plurality of open slots 203 are filled with the interlayer dielectric material 105. In the inter-metal layer 106, there is a metal interconnect 107 wherein the metal interconnect 107 is made of at least one of metals comprising Cu and TiN. The interlayer dielectric material 105, the dielectric layer 104 and the inter-metal layer 106 are made of at least one of dielectric materials comprising silicon oxide and silicon nitride. In one example, they are made of same dielectric materials. In another example, they are made of different dielectric materials.

FIG. 2D illustrates a cross sectional view of the example image sensor 200 after a contact pad trench 204 is formed in the example image sensor 200 of FIG. 2C. The corresponding process block is 404 in FIG. 4. In one example, the contact pad trench 204 extends from the back side 109 of the semiconductor material 102 into the semiconductor material 102 until lands on a first side 218 of the plurality of first STI structure 201a and second STI structure 201b, wherein the sidewalls of the contact pad trench 204 land on the plurality of the second STI structures 201b. In one example, the contact pad trench 204 is formed by a fourth patterning process which comprises at least a fourth photolithography process followed by at least one of a fourth anisotropic plasma etch and a fourth selective wet etch process. The fourth etch processes have significantly higher etch rate for the semiconductor material 102 compared to the dielectric materials in the plurality of the first STI structures 201a and the second STI structures 201b. Moreover, the etch time is preciously monitored and controlled during the plasma dry etch and the selective wet etch processes in order to avoid over etch and under etch. As a result, the fourth etch processes stop on the first side 218 of the first STI structures 201a and the second STI structures 201b. There are portions 206 of the semiconductor material 102 remained between adjacent first 201a and second 201b STI structures, which will be used as a hard mask in the following self-aligned patterning process steps. In another example, the contact pad trench 204 extends from the buffer layer 101 into the semiconductor material 102, wherein the buffer layer 101 is also selectively etched during the fourth patterning process to form the contact pad trench 204.

FIG. 2E illustrates a cross sectional view of the example image sensor 200 after a plurality of contact plugs 205 and at least one air gap 208a are formed in the example image sensor 200 of FIG. 2D. The corresponding process block is 405 in FIG. 4. Each of the plurality of contact plugs 205 extends from the first side 218 of the first 201a and second 201b STI structure through the dielectric layer 104, the interlayer dielectric material 105 and lands on the metal interconnect 107 at the interface 114 between the interlayer dielectric material 105 and the metal interconnect 107.

In one example, each of the plurality of contact plugs 205 is formed by a self-aligned patterning process, wherein the portions 206 of the semiconductor material 102 are used as a hard mask to define the plurality of the contact plugs 205 and the air gaps 208a. Therefore, the self-aligned patterning process comprises only a fifth selective etch process without a fifth photolithography process, which may help to reduce the fabrication cost and simplify the fabrication process by minimizing the number of photolithography steps.

During the fifth selective etch process, the dielectric materials defined by the portions 206 of the semiconductor material 102 are selectively removed by at least one of selective anisotropic plasma dry etch and a selective wet etch processes. The removed dielectric materials include the dielectric materials in each of the plurality of the first STI structure 201a and a partial second STI structure 201b, the dielectric materials in each of the plurality of open slots 203 in the poly layer 202, a portion of the dielectric layer 104, and a portion of the interlayer dielectric material 105. The portion of the dielectric layer 104 and the portion of the interlayer dielectric material 105 are self-aligned with the STI structures, wherein the portions 206 of the semiconductor material 102 are used as a hard mask during the selective etch processes. The selective plasma dry etch and the selective wet etch processes have significantly higher etch rates for the dielectric materials in the STI structures 201a and 201b, the dielectric layer 104 and the interlayer dielectric material 105, than the etch rates for the conductive materials in the metal interconnect 107 and the semiconductor materials in the portions 206 of the semiconductor material 102 and the poly layer 202. As a result, the selective etch processes automatically slow down greatly at the interface 114 between the interlayer dielectric material 105 and the metal interconnect 107 so as to form the plurality of contact plugs 205, wherein each of the plurality of contact plugs 205 lands on the metal interconnect 107. Moreover, the selective etch processes also automatically slow down greatly at the interface between the poly layer 202 and the dielectric layer 104, so as to form at least one air gap 208a, wherein each of the air gaps lands on the poly layer 202. In one example, after the selective anisotropic etch processes are finished, there are a portion of the dielectric materials remained in each of the plurality of the second STI structures 201b between the air gaps and the semiconductor material 102.

FIG. 2F illustrates a cross sectional view of the example image sensor 200 after a contact pad 207 and at least one air gap 208b are formed in the example image sensor 200 of FIG. 2E. The corresponding process block is 406 in FIG. 4. In the contact pad trench 204, the contact pad 207 is disposed on the first side 218 of the plurality of first STI structures 201a and second STI structures 201b. The contact pad 207 is coupled with the metal interconnect 107 by the plurality of contact plugs 205. In one example, each of the plurality of the contact plugs 205 is filled by at least one of conductive materials comprising Al, and the contact pad 207 is made of the same conductive materials as the conductive materials in each of the plurality of the contact plugs 205. In another example, the contact pad 207 is made of different conductive materials than the conductive materials in each of the plurality of the contact plugs 205. The conductive materials comprise at least one of Al, Cu, W, and TiN. There is at least one air gap 208a and at least one air gap 208b between the contact pad 207 and sidewalls of the contact pad trench 204, wherein the air gaps isolate the contact pad 207 from the semiconductor material 102.

In one example, the contact pad 207 and the air gap 208a and 208b are formed by a sixth patterning process which comprises at least a sixth photolithography process followed by at least one of a sixth anisotropic plasma dry etch and a sixth selective wet etch process. In the sixth etch processes, the sixth etch rates for the conductive materials in the contact pad 207 and the contact plugs 205 are significantly higher than the sixth etch rates for the dielectric materials in the STI structures (201a and 201b) and the semiconductor material 102 and 206. Therefore, the sixth etch processes stop on the first side 218 of the STI structures (201a and 201b) and there is no undercut on sidewalls of the contact pad trench 204.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
   a semiconductor material having a front side and a back side opposite the front side;
   a dielectric layer disposed on the front side of the semiconductor material;
   a poly layer disposed on the dielectric layer;
   an interlayer dielectric material covering both the poly layer and the dielectric layer;
   an inter-metal layer disposed on the interlayer dielectric material, wherein a metal interconnect is disposed in the inter-metal layer; and
   a contact pad trench extending from the back side of the semiconductor material into the semiconductor material, wherein the contact pad trench comprises:

a contact pad disposed in the contact pad trench, wherein the contact pad and the metal interconnect are coupled with a plurality of contact plugs; and at least an air gap between the contact pad and side walls of the contact pad trench.

2. The image sensor of claim 1, wherein the air gap extends from side walls of the contact pad trench through the semiconductor material and the dielectric layer, and vertically abuts the poly layer.

3. The image sensor of claim 1, wherein each of the plurality of contact plugs extends through the semiconductor material, the dielectric layer, the poly layer and the interlayer dielectric material, and vertically abuts the metal interconnect.

4. The image sensor of claim 1, wherein a buffer layer is disposed on the back side of the semiconductor material, wherein the buffer layer comprises at least one of dielectric materials including silicon oxide and silicon nitride.

5. The image sensor of claim 1, wherein the interlayer dielectric material, the dielectric layer and the inter-metal layer are made of at least one of dielectric materials comprising silicon oxide and silicon nitride.

6. The image sensor of claim 5, wherein the interlayer dielectric material, the dielectric layer and the inter-metal layer are made of same dielectric materials.

7. The image sensor of claim 1, wherein the contact pad and the plurality of contact plugs are made of at least one of conductive materials comprising Al.

8. The image sensor of claim 7, wherein the contact pad and the plurality of contact plugs are made of same conductive materials.

9. The image sensor of claim 1, wherein the metal interconnect is made of at least one of metals comprising Cu and TiN.

10. A method of image sensor fabrication, comprising:
providing a semiconductor material having a front side and a back side opposite the front side;
forming a plurality of first shallow trench isolation (STI) structures and a plurality of second STI structures extending from the front side of the semiconductor material into the semiconductor material, wherein each of the plurality of first STI structures is fully surrounded by adjacent first and second STI structures and each of the plurality of second STI structures is partially surrounded by adjacent first and second STI structures;
disposing a dielectric layer and a poly layer on the front side of the semiconductor material, wherein the poly layer is disposed on the dielectric layer, wherein a plurality of open slots are formed in the poly layer extending from a first side of the poly layer to the interface of the poly layer and the dielectric layer, wherein each of the plurality of open slots aligns up with each of the plurality of first STI structures and has same two dimensional lateral dimensions as the aligned first STI structure;
disposing an interlayer dielectric material at the front side of the semiconductor material, wherein the dielectric layer and the poly layer are covered by the interlayer dielectric material, wherein the plurality of open slots are filled with the interlayer dielectric material;
forming a metal interconnect in an inter-metal dielectric layer, wherein the inter-metal dielectric material is disposed on the interlayer dielectric material;
forming a contact pad trench by partially removing the semiconductor material between the backside of the semiconductor and a first side of the plurality of first and second STI structures, wherein the edge of the contact pad trench locates on the plurality of second STI structures;
forming a plurality of contact plugs by selectively removing the dielectric material between the first side of each of the plurality of first STI structures and the metal interconnect; wherein each of the plurality of contact plugs extends from the first side of each of the plurality of first STI structures through each of the plurality of first STI structures into the interlayer dielectric material and vertically abuts the metal interconnect; and
forming a contact pad by disposing a conductive material in the contact pad trench, wherein the contact pad is isolated from the sidewalls of the contact pad trench, and are coupled with the metal interconnect by the plurality of contact plugs wherein the plurality of contact plugs are filled with the conductive material.

11. The method of image sensor fabrication in claim 10, wherein the poly layer and the semiconductor material between adjacent two STI structures are used as hard masks to form the plurality of contact plugs by selectively removing the dielectric materials between the first side of the plurality of first STI structures and the metal interconnect.

12. The method of image sensor fabrication in claim 10, further comprising a buffer layer disposed on the back side of the semiconductor material, wherein the buffer layer comprises at least one of dielectric materials including silicon oxide and silicon nitride.

13. The method of image sensor fabrication in claim 10, wherein the interlayer dielectric material, the dielectric layer and the inter-metal layer are made of at least one of dielectric materials comprising silicon oxide and silicon nitride.

14. The method of image sensor fabrication in claim 13, wherein the interlayer dielectric material, the dielectric layer and the inter-metal layer are made of same dielectric materials.

15. The method of image sensor fabrication in claim 10, wherein the contact pad and the plurality of contact plugs are made of at least one of conductive materials comprising Al.

16. The method of image sensor fabrication in claim 15, wherein the contact pad and the plurality of contact plugs are made of same conductive materials.

17. The method of image sensor fabrication in claim 10, wherein the metal interconnect is made of at least one of metals comprising Cu and TiN.

18. The method of image sensor fabrication in claim 10, wherein the contact pad is isolated from the sidewalls of the contact pad trench by at least one air gap.

19. The method of image sensor fabrication in claim 18, wherein the air gap extends from the side wall of the contact pad trench through the semiconductor material and the dielectric layer, and vertically abuts the poly layer.

* * * * *